(12) United States Patent
Kim et al.

(10) Patent No.: US 8,071,955 B2
(45) Date of Patent: Dec. 6, 2011

(54) MAGNETIC DEFLECTOR FOR AN ELECTRON COLUMN

(75) Inventors: Ho Seob Kim, Incheon (KR); Young Chul Kim, Asan-si (KR)

(73) Assignee: Cebt Co. Ltd. (KR)

( * ) Notice: Subject to any disclaimer, the term of this patent is extended or adjusted under 35 U.S.C. 154(b) by 201 days.

(21) Appl. No.: 12/600,266

(22) PCT Filed: May 15, 2008

(86) PCT No.: PCT/KR2008/002713
§ 371 (c)(1),
(2), (4) Date: Nov. 15, 2009

(87) PCT Pub. No.: WO2008/140273
PCT Pub. Date: Nov. 20, 2008

(65) Prior Publication Data
US 2010/0148086 A1    Jun. 17, 2010

(30) Foreign Application Priority Data
May 15, 2007    (KR) .................. 10-2007-0047350

(51) Int. Cl.
*H01J 3/26*    (2006.01)
*H01J 37/14*    (2006.01)
*H01J 37/147*    (2006.01)

(52) U.S. Cl. ......... 250/396 ML; 250/396 R; 250/492.2; 250/492.3

(58) Field of Classification Search ........... 250/396 ML, 250/396 R, 492.2, 492.3; 335/210, 213
See application file for complete search history.

(56) References Cited

U.S. PATENT DOCUMENTS

| 3,406,273 | A  | * | 10/1968 | Holland | ............... 219/121.29 |
| 5,847,402 | A  | * | 12/1998 | Nakasuji | ............... 250/492.2 |
| 6,633,366 | B2 |   | 10/2003 | De Jager et al. | |
| 7,112,803 | B2 | * | 9/2006 | Petrov et al. | ............... 250/396 R |
| 7,902,521 | B2 | * | 3/2011 | Kim et al. | ............... 250/396 R |
| 2002/0148971 | A1 | * | 10/2002 | Sogard | ............... 250/396 R |

FOREIGN PATENT DOCUMENTS
JP    2003-187730 A    7/2003
WO    WO 2006/004374 A1    1/2006
* cited by examiner

*Primary Examiner* — Nikita Wells
(74) *Attorney, Agent, or Firm* — John K. Park; Park Law Firm

(57) ABSTRACT

The present invention relates, in general, to a deflector for microcolumns for generating electron beams, and, more particularly, to a deflector capable of scanning or shifting electron beams or functioning as a stigmator using a magnetic field. The deflector (100) according to the present invention includes one or more deflector electrodes. Each of the deflector electrodes includes a core (12) made of a conductor or a semiconductor, and a coil (11) wound around the core (12).

19 Claims, 6 Drawing Sheets

[Fig. 1]
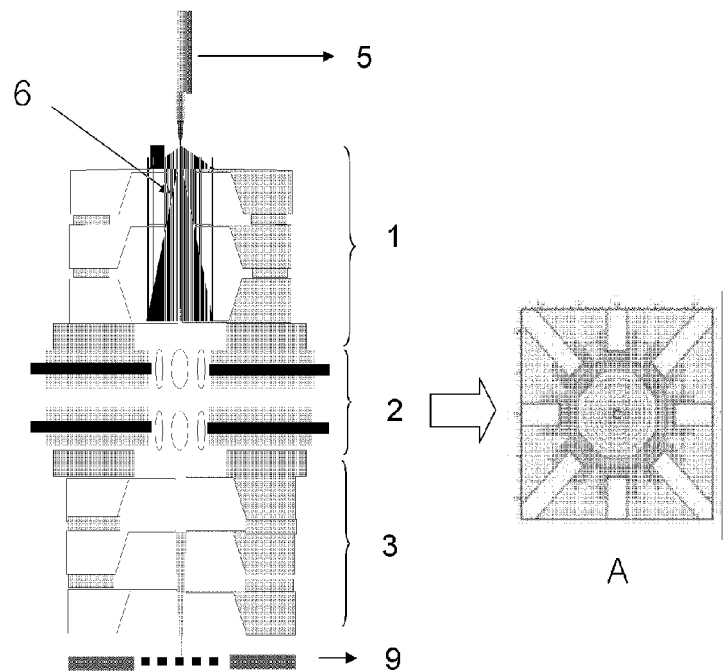
[Fig. 2]
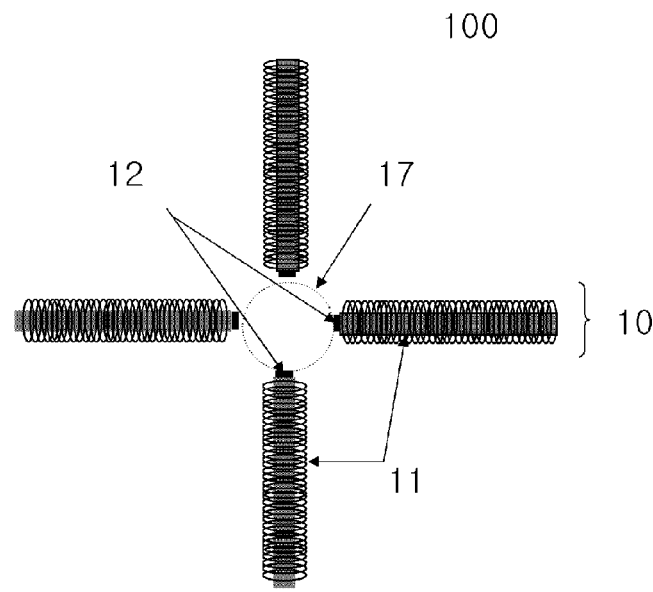
[Fig. 3]
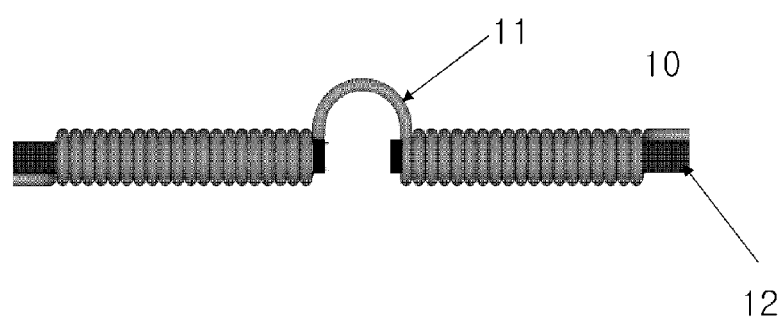

[Fig. 4]
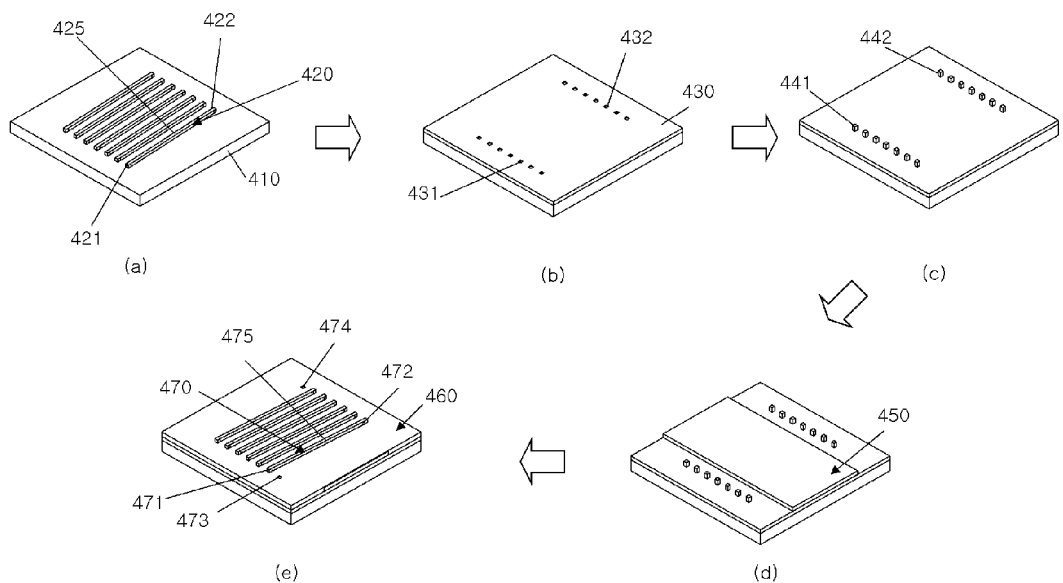
[Fig. 5]
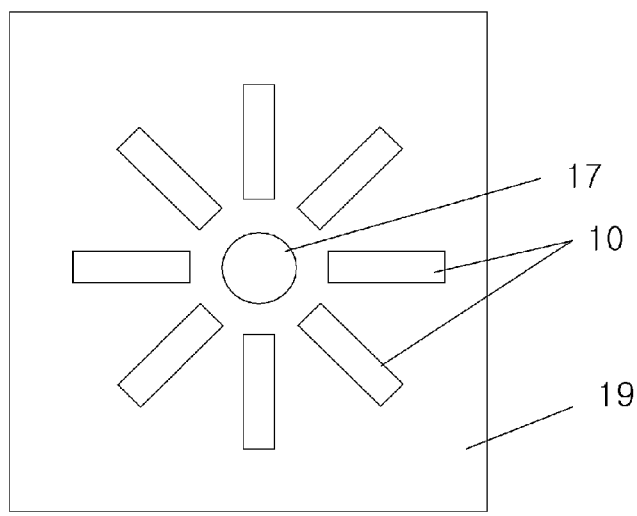

[Fig. 6]
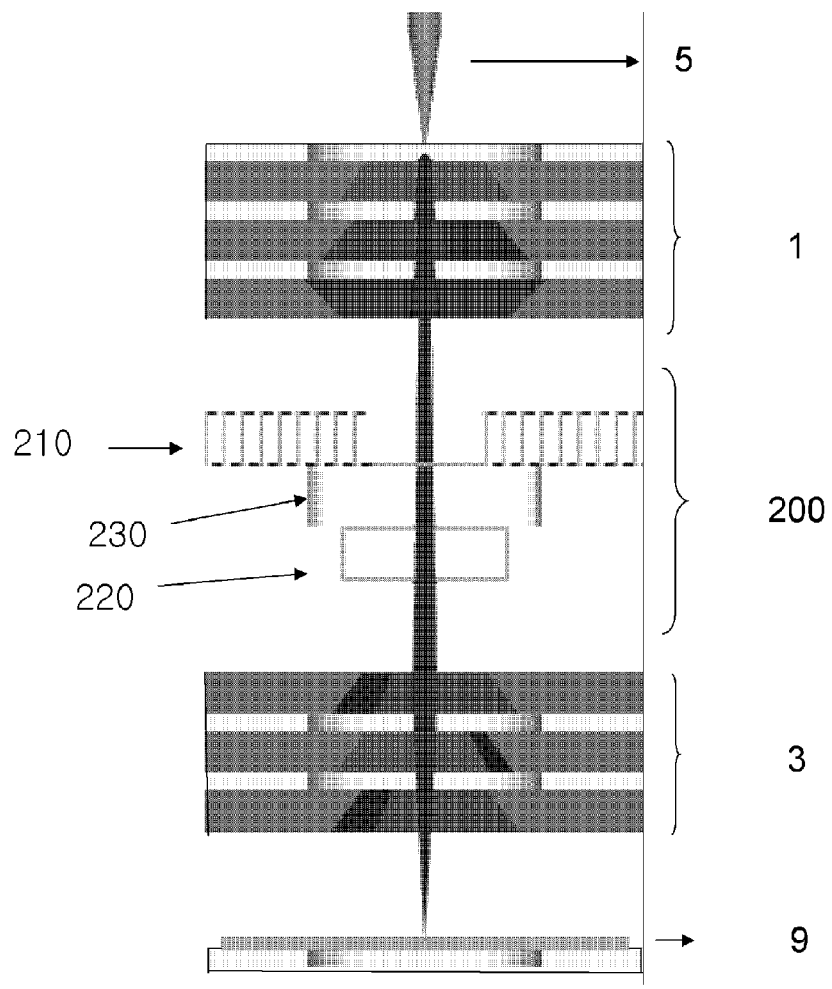
[Fig. 7]
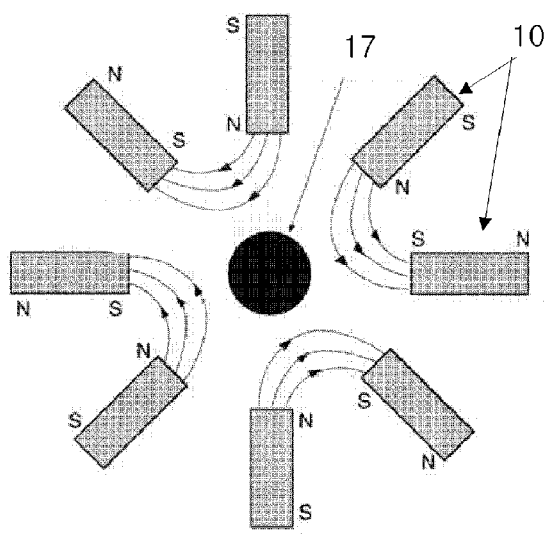

[Fig. 8]
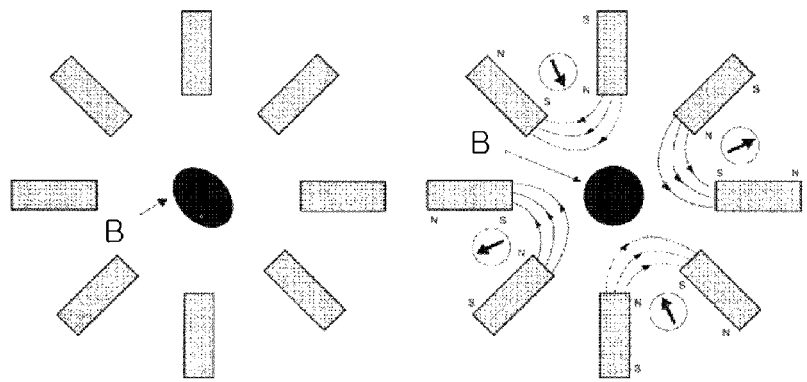
[Fig. 9]
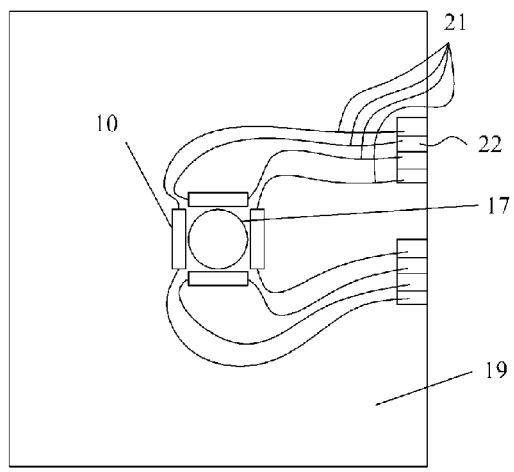
[Fig. 10]
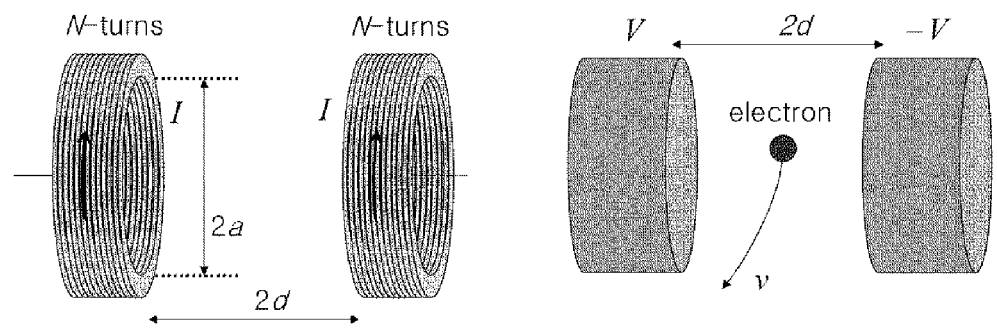

[Fig. 11]
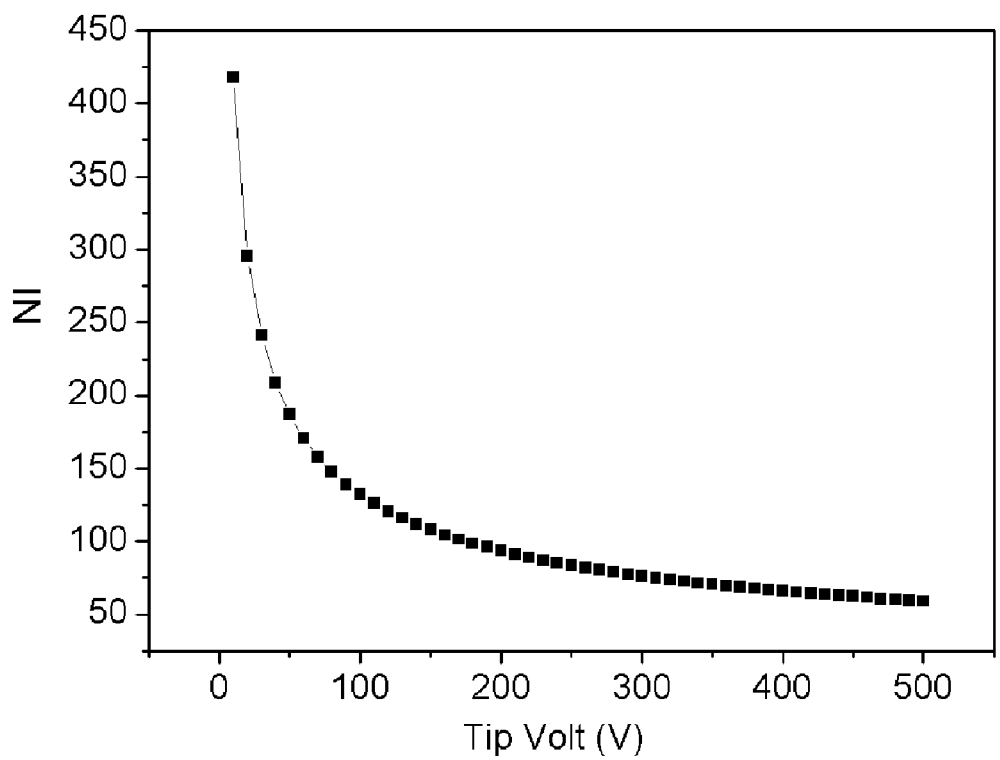
[Fig. 12]
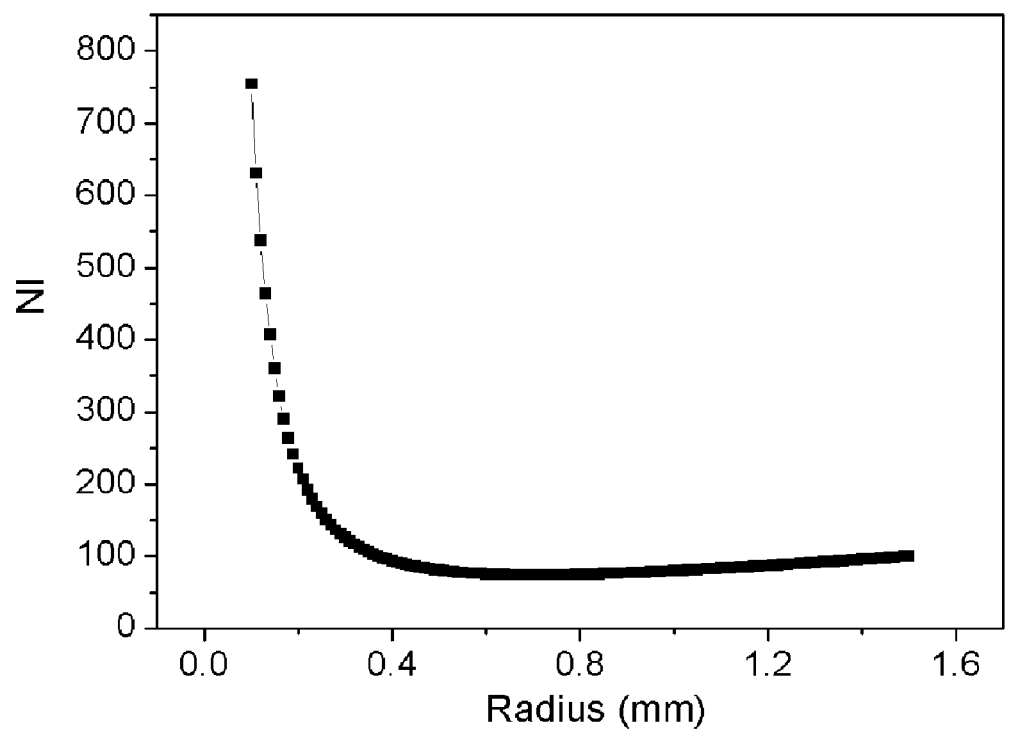

[Fig. 13]
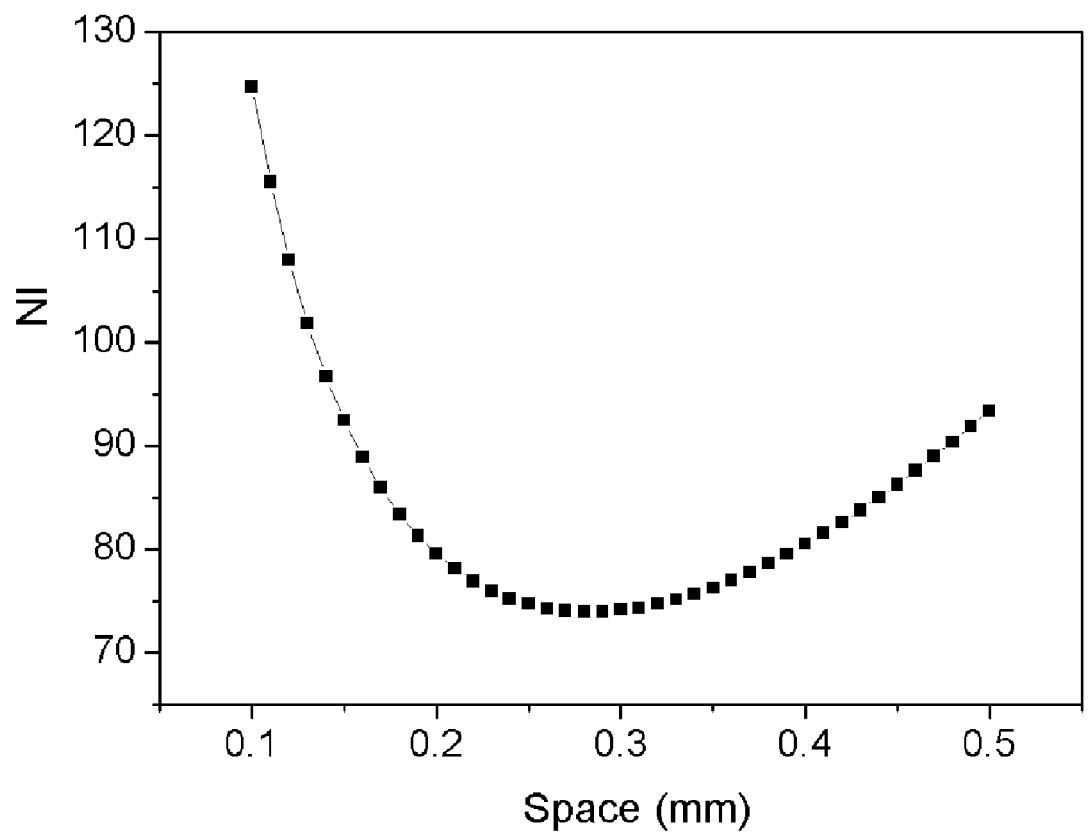

MAGNETIC DEFLECTOR FOR AN ELECTRON COLUMN

TECHNICAL FIELD

The present invention relates, in general, to a deflector for microcolumns for generating electron beams, and, more particularly, to a deflector capable of scanning or shifting electron beams or functioning as a stigmator using a magnetic field.

BACKGROUND ART

A conventional electron column is generally operated in such a way that an electron emitter emits electrons, a source lens forms the electrons as electron beams, a deflector deflects the electron beams, and a focusing lens focuses the deflected electron beams onto a sample.

There is an example in which a magnetic deflector is used in an electron column, but such a magnetic deflector is used in a large-sized electron column and is merely a typical magnetic deflector that is very large.

Therefore, in a conventional microcolumn, such a deflector mainly deflects electron beams using an electric field.

FIG. 1 is a sectional view conceptually showing a 1 KV microcolumn based on the concept of a well-known Scanning Tunneling Microscope (STM) alignment field method as a representative microcolumn. In FIG. 1, a source lens 1, a deflector 2 and an Einzel lens 3 are shown. An electron emitter 5 attached to an STM-type positioner emits an electron beam 6 onto a sample surface 9. Such a beam 6 passes through the source lens 1, composed of silicon microlenses, for example, an extractor having a diameter of 5 μm on the central axis thereof an acceleration electrode having a diameter of 100 μm, and a limiting aperture having a diameter of 2.5 μm. The deflector 2 is placed below the source lens 1. The deflector is composed of eight electrodes, as shown in the plan view A on the right side of FIG. 1, and scans the electron beam emitted from the source lens 1. Thereafter, the electron beam 6 passes through the Einzel lens 3. Such an Einzel lens is composed of silicon microlenses having a diameter of 100 to 200 μm, and silicon holes having a thickness of 1 to 2 μm and a size of 1×1 mm are formed in the center of the microlenses. Respective silicon layers are separated and spaced apart from each other by a predetermined interval using an insulating spacer. Thereafter, the electron beam 6 is incident on the sample surface 9, so that secondary electrons are emitted and are detected using a Channeltron detector or the like.

Generally, the above lenses and detector are manufactured as electron lenses through a Micro-electro-mechanical systems (MEMS) process and are used. Of course, a deflector can be used through the use of a conductor wire, but is also manufactured through an MEMS process to realize precision as well as the convenience of manufacture of an electron column. However, electron lenses generally function as optical lenses using an electric field or a magnetic field, and a deflector also generally performs deflection using an electric field. However, in the case of an electric field, a spherical aberration or a color aberration is poor, or a high voltage of about 100V must be applied, in the case of the lenses. Therefore, it is difficult to use a typical magnetic deflector due to the size of a microcolumn in a current situation, and thus the development of a magnetic deflector usable for a microcolumn is required.

DISCLOSURE OF INVENTION

Technical Problem

Accordingly, the present invention is intended to solve the problems occurring in a conventional electric deflector in the above microcolumn and to improve performance, and an object of the present invention is to provide a deflector, which can deflect electron beams using a magnetic field having less aberration than an electric field, or can selectively or simultaneously use an electric field and a magnetic field.

Technical Solution

In order to accomplish the above object, the present invention provides a deflector for microcolumns, which comprises one or more electrodes, each having a core and a coil wound around the circumference of the core. Further, the present invention is characterized in that the electrodes are radially or circumferentially formed on the path of electron beams.

First, the basic principles of the magnetic deflector according to the present invention are described below.

FIG. 10 is a diagram showing electrons subjected to a force due to an electric field and a magnetic field. An electric deflector generates an electric field of $E=V/d$ in the center thereof using an applied voltage, and thus electrons are subjected to a force of $q_e E$. In the case of a magnetic deflector, when current is caused to flow through wound coils, a magnetic field of $$B = \frac{\mu_0 a^2}{(d^2 + a^2)^{3/2}} NI$$

is generated in the center of the coils. Electrons passing through this space are subjected to a force of $q_e vB$ due to the magnetic field, where $v$ is the velocity of electrons and is determined by the tip voltage $V_{tip}$ of an electron emitter, that is, $$V_{tip}(\text{eV}) = \frac{1}{2} m_e v^2 \Rightarrow$$

$$v = 5.9 \times 10^5 \sqrt{V_{tip}} \ (m/s)$$

The condition in which the magnetic force generated by the magnetic deflector is identical to the electric force generated by the conventional electric deflector is given by the following equation.

$$|F_B| = |F_E| \Rightarrow q_e vB = q_e E$$

$$NI = \frac{(d^2 + a^2)^{3/2}}{\mu_0 a^2} \frac{V}{vd}$$

Therefore, the magnetic force can be controlled by adjusting the number of turns of the coils and current I flowing through the coils. In the above equation, NI is dependent on the radius 'a' of the coils, the space 'd' between the coils, and the velocity 'v' of the electrons, and a graph corresponding to NI is shown in FIG. 11.

When the tip voltage increases, the velocity of the electrons increases. As the velocity increases, the magnetic force increases even if the intensity of a magnetic field is uniform.

Therefore, this means that electrons can be controlled using low NI in inverse proportion to the velocity of the electrons. This can be regarded as a great advantage compared to the electric deflector, to which a high voltage must be applied as the velocity of electrons increases.

The intensity of the magnetic field is dependent on the space 'd' and the radius 'a' in the center of the deflector. Therefore, NI also varies according to the two values. The dependence of NI on the two values is shown in the following FIGS. 12 and 13.

NI shows a shape which decreases and then increases as the space 'd' and the radius 'a' of the deflector increase. When the space or the radius of the deflector increases, the intensities of both a magnetic field and an electric field are attenuated in the center of the deflector, and thus a high NI value is required. The condition in which the NI value is minimized is $a^2-2d^2=0$. Therefore, the minimized NI value is obtained when $\alpha=\sqrt{2}d$
is satisfied.

Advantageous Effects

As described above, a magnetic deflector for microcolumns according to the present invention can easily generate both an electric field and a magnetic field, thus deflecting electron beams using the electric field and/or the magnetic field according to the circumstances. Further, when the tip voltage of an electron emitter increases, and then the velocity of electrons increases, a high voltage must be applied when a conventional electric deflector is used, whereas the electrons can be sufficiently controlled using only a small amount of current when the magnetic deflector is used. Therefore, the present invention can effectively control electron beams by selectively using the magnetic deflector and the electric deflector according to the velocity of the electrons.

Further, the magnetic deflector for microcolumns according to the present invention can also function as a stigmator for correcting astigmatism.

Further, the magnetic deflector for microcolumns according to the present invention can function as a deflection unit for aligning the path of electron beams in a certain direction.

BRIEF DESCRIPTION OF THE DRAWINGS

FIG. 1 is a sectional diagram showing a typical electron column;

FIG. 2 is a plan view showing a magnetic deflector according to the present invention;

FIG. 3 is a perspective view showing an embodiment of a magnetic deflector electrode according to the present invention;

FIG. 4 is a view showing the flow of a process for manufacturing magnetic deflector electrodes according to the present invention;

FIG. 5 is a plan view showing a deflector composed of the magnetic deflector electrodes of FIG. 4;

FIG. 6 is a sectional view showing a microcolumn in which a magnetic deflector according to the present invention is used;

FIG. 7 is a plan view showing a structure in which the deflector according to the present invention functions as a stigmator;

FIG. 8 is a schematic plan view showing the correction of aberrations of electron beams performed by the deflector of FIG. 7;

FIG. 9 is a plan view showing an example in which the arrangement of magnetic deflector electrodes 10 according to the present invention is changed;

FIG. 10 is a conceptive diagram showing electrons to be forced by an electric field and a magnetic field;

FIG. 11 is a graph showing the relationship between NI and tip voltages;

FIG. 12 is a graph showing the relationship between NI and the radius 'a'; and

FIG. 13 is a graph showing the relationship between NI and the space 'd'.

MODE FOR THE INVENTION

Hereinafter, a deflector for scanning a scan target with electron beams according to the present invention will be described in detail with reference to the attached drawings.

FIG. 2 is a plan view showing an embodiment of a deflector according to the present invention. In FIG. 2, a deflector 100 includes four deflector electrodes 10. Each unit deflector electrode 10 includes a core 12, made of a conductor such as metal, or a highly-doped semiconductor, and a coil 11 wound around the core 12. The coil 11 can be implemented using a coated conducting wire such as an enamel wire so that it can be wound around the core 12. A circle 17 indicated by a dotted line denotes a path along which an electron beam passes in the deflector 100, and the electron beam is deflected in the circle 17. As shown in FIG. 2, in each typical deflector electrode, the core is generally implemented using a conductive metal rod made of molybdenum or the like, and the coil can be implemented using a typical enamel wire or the like. Of course, it is possible to configure the magnetic deflector according to the present invention using only a coil without including a conductive core, but it is preferable to configure the deflector including the conductive core so as to realize more precise and strong deflection. That is, each deflector electrode is manufactured as a type of electromagnet, and a magnetic deflector, similar to the deflector of a conventional electron column, is manufactured using the deflector electrodes, and thus deflection can be performed by the magnetic deflector.

FIG. 3 illustrates a structure in which two deflector electrodes 10 are configured in such a way that a single wire is wound around two cores 12 in the form of a coil 11. In this case, since only a single coil wire 11 is used, the number of wires of deflector electrodes to be controlled can be reduced by half. That is, the reason for this is that the number of wires is reduced to half of the number in the case in which a single wire is formed into a coil for each of deflector electrodes. Therefore, when the coil of FIG. 3 is used, cores are preferably used to be opposite each other. However, the cores are not necessarily opposite each other, but may be arranged and used at an angle of 45, 90, or 120 degrees as needed. A representative of other purposes of the deflector is a function as a stigmator, which will be described below. When three cores are operated to form a single set, respective coils are connected in series with each other, and thus two wires can be connected to the outside with respect to three cores, and can be controlled.

The unit deflector electrodes are preferably radially arranged outside the path along which an electron beam passes. In order to facilitate control by minimizing the number of wires, as shown in the above drawing the number of control targets can be reduced from the standpoint of the same effect if symmetric electrodes use a single continuous coil across a center hole.

Further, the deflector according to the present invention can be manufactured through an MEMS process.

FIG. 4 is a diagram showing an example in which a magnetic deflector according to the present invention can be manufactured through an MEMS process.

First, in process (a), seven wires are formed as patterns in the shape of long bars using a conductor such as metal, or a semiconductor material, so as to obliquely form lower coils 420 on an insulating plate 410. Further, separate regions are provided at both ends 421 and 422 of each coil to easily realize successive lamination, and lower coil wires 425 are obliquely connected between the regions. In process (b), all of the lower coils except for the lamination regions (both ends of the coils) provided in process (a) are coated with an insulating material, and thus an insulating layer 430 is formed, with both ends 431 and 432 remaining on the insulating layer 430 to maintain both ends of the coils. In process (c), both ends 441 and 442 are laminated on the remaining lamination regions using conductors, and then protrude from the insulating material. In process (d), a conductor or a semiconductor is formed between both ends of respective coils in the shape of a long tetrahedron in order to function as a core, and thus a core unit 450 is formed. In process (e), partition units 471 and 472 at both ends of the coils and the core unit 450 are coated with an insulating material, as shown in process (b), and thus an insulating layer 460 is formed. Upper coil wires 475 are formed as patterns having the shape of long bars between both the partition units 471 and 472 so that the patterns of the upper coil wires alternate with the patterns formed in process (a), and thus the coils are completed. In this way, deflector electrodes 473 and 474 can be formed to have a shape in which coils are wound around the core. In process (e), both the partition units 473 and 474 can be used for wiring and can be formed in a single plane in a number corresponding to the number of required deflector electrodes. The portion through which an electron beam penetrates can be formed through etching or laser processing.

FIG. 5 is a plan view showing a deflector composed of the magnetic deflector electrodes of FIG. 4, in which eight deflector electrodes 10 form a deflector 100 in the plane of a single support plate 19. In the center of the deflector 100, an aperture 17 is formed to allow an electron beam to penetrate therethrough. The electron beam is deflected by the deflector electrodes 10. In the drawing the aperture is formed in a circular shape, but any shape of aperture having a size sufficient to allow an electron beam to be deflected, for example, a polygonal aperture, such as a triangular or a rectangular aperture, can be used as the aperture of the deflector according to the present invention.

The deflector of the present invention can be classified into an open-type deflector and a closed-type deflector according to the core. The open-type deflector refers to a deflector in which respective electrodes have their own individual cores and are independently controlled. In the open-type deflector, respective electrodes are independently controlled, and thus the number of variables can increase at the time of deflection. Therefore, in the case of a multi-electron column, control may be complicated, but the open-type deflector may be preferable when various types of control are required. That is, when a core is used as a composite type, like an electric deflector, the open-type deflector can be profitable.

The closed-type deflector refers to a deflector in which respective electrodes share a common core with each other, and merely use individual coils. Therefore, when a plurality of deflector electrodes is used as a deflector, a plurality of coils can be wound around a single core and used, and thus the closed-type deflector is profitable.

FIG. 6 is a sectional diagram showing a microcolumn in which the magnetic deflector of the present invention is used, and shows an embodiment in which a magnetic deflector 200 according to the present invention is used. FIG. 6 illustrates a structure in which a deflector 200, having the same construction as that of the electron column of FIG. 1, is implemented as two layers 210 and 220, and in which the interval between the two layers 210 and 220 is maintained by an insulating layer 230, and the upper layer deflector 210 and the lower layer deflector 220 are arranged opposite each other. The deflectors can be used in the same way as a typical deflector.

FIG. 7 is a plan view of a structure in which the deflector of the present invention functions as a stigmator, and shows that respective neighboring deflector electrodes 10 form pairs, and are used to correct aberrations, such as the astigmatism of an electron beam passing through a central aperture 17. Each pair of deflector electrodes forms a magnetic field, thus mitigating the aberrations of the electron beam. Respective electromagnetic fields attract or repulse electrons, passing through the central aperture 17, and thus the aberrations of the electron beam can be corrected.

FIG. 8 is a schematic plan view showing a process in which an electron beam B is corrected using the deflector of FIG. 7. The drawing shows a process for returning a distorted circular electron beam B to a normal circular beam by repulsing or attracting the distorted circular electron beam B using an electromagnetic field by way of the deflector of the present invention.

The method of deflecting an electron beam in the magnetic deflector according to the present invention functions to control the direction and amount of current flowing into coils in respective deflector electrodes. In the above-described magnetic deflector, coils are connected to an external current source, and thus the amount and direction of current are controlled.

The deflector according to the present invention can be used in place of a conventional deflector, and the location thereof can be changed as needed. That is, the deflector can be located between a conventional Einzel lens and a sample to perform deflection. According to the circumstances, the arrangement of the deflector at a specific location as needed can be performed using the same method as for a conventional deflector.

When wiring is performed on cores in the magnetic deflector according to the present invention, the deflector can be immediately used as a conventional electric deflector. Therefore, when wires are connected both to the coils and to the cores using the same structure, the deflector can be used as both an electric deflector and a magnetic deflector. When no current source is connected to the coils and voltage is applied only to the cores in the magnetic deflector according to the present invention, the deflector can be used as an electric deflector. In contrast, when current from a current source is applied to the coils, the deflector can be used as a magnetic deflector. When voltages are applied both to the coils and to the cores, the deflector can be used as an electromagnetic deflector.

Further, the magnetic deflector according to the present invention can be used for the same purpose as a conventional deflector. That is, all methods, which have been used to perform deflection, can be used in the same manner, and the deflector can also be used as an electromagnetic deflector, and thus the deflector of the present invention can be used in various forms compared to the conventional deflector. For example, in FIG. 6, it is possible to perform deflection by mounting the deflector 200 in a portion below the Einzel lens 3 or the focusing lens, and it is also possible to finally add deflection by mounting an additional deflector. Further, the deflector can function as a deflection unit for shifting the path of an electron beam when the path of the electron beam becomes abnormal regardless of the location on the microcolumn.

For the control of deflection, only the current of coils needs to be controlled, instead of voltage control. When the deflector is used as an electromagnetic type, only separate wires need to be connected to the cores, and control can be performed by directly applying voltage to the cores, as in the case of an electromagnetic electrode. Only typical control for scanning needs to be performed upon the application of current or voltage at the time of scanning. Further, when the deflector performs alignment of an electron beam or functions as a stigmator, only the application of constant current or constant voltage to respective deflector electrodes is required.

FIG. 9 is a plan view showing an example in which the arrangement of magnetic deflector electrodes 10 according to the present invention is changed.

Unlike FIG. 5, magnetic deflector electrodes 10 are arranged on a support plate 19 around an aperture 17 in the shape of a rectangle, as shown in FIG. 9. The magnetic deflector arranged in this way deflects an electron beam using a magnetic field generated from coils. Respective magnetic deflector electrodes 10 are connected to a wiring part 22 provided at a portion of the support plate 19 through wires 21, and the magnetic deflector electrodes 10 are controlled through the wiring part 22.

In FIG. 9, magnetic deflector electrodes are arranged in the shape of a rectangle, but may also be arranged in a triangular or polygonal shape. Each of the magnetic deflector electrodes may be formed in the shape of an arc, so that respective magnetic deflector electrodes can be entirely arranged in a shape identical or similar to a circle around an aperture through which an electron beam passes. However, from the standpoint of control, the above symmetrical arrangement may be occasionally more convenient.

INDUSTRIAL APPLICABILITY

As described above, a microcolumn using a magnetic deflector according to the present invention can be used for electronic microscopes, semiconductor lithography, or inspection devices using electron beams, for example, defect inspection on via holes/contact holes of semiconductor devices, sample surface inspection and analysis, and defect inspection on Thin Film Transistors (TFTs) in TFT-LCD devices.

What is claimed is:

1. A magnetic deflector for microcolumns, comprising:
   one or more deflector electrodes, each comprising, a core made of a conductor or a semiconductor; and
   a coil wound around the core wherein the deflector electrodes are radially arranged opposite each other to be perpendicular to a path along which an electron beam passes, or are arranged in a shape of a circle or a polygon.
2. The magnetic deflector according to claim 1, wherein two or more deflector electrodes are connected in series with each other between respective coils and are simultaneously controlled.
3. The magnetic deflector according to claim 1, wherein, when the cores are arranged opposite each other, a control voltage or current can be applied to the cores and the coils respectively, and thus the cores and the coils can be selectively or simultaneously controlled.
4. The magnetic deflector according to claim 3, wherein the cores function as a stigmator or a deflection unit for aligning an electron beam with a proviso that the coils selectively or simultaneously function as a deflector, or the coils function as a stigmator or a deflection unit for aligning an electron beam with a proviso that the cores selectively or simultaneously function as a deflector.
5. A microcolumn using the magnetic deflector according to claim 1.
6. The microcolumn according to claim 5, wherein, when the cores of the magnetic deflector are arranged opposite each other, a control voltage or current can be applied to the cores and the coils respectively, and thus the cores and the coils can be selectively or simultaneously controlled.
7. The microcolumn according to claim 6, wherein the cores function as a stigmator with a proviso that the coils selectively or simultaneously function as a deflector, or the coils function as a stigmator with a proviso that the cores selectively or simultaneously function as a deflector.
8. The microcolumn according to claim 5, wherein the magnetic deflector is arranged below a focusing lens.
9. The magnetic deflector according to claim 2, wherein, when the cores are arranged opposite each other, a control voltage or current can be applied to the cores and the coils respectively, and thus the cores and the coils can be selectively or simultaneously controlled.
10. The magnetic deflector according to claim 9, wherein the cores function as a stigmator or a deflection unit for aligning an electron beam with a proviso that the coils selectively or simultaneously function as a deflector, or the coils function as a stigmator or a deflection unit for aligning an electron beam with a proviso that the cores selectively or simultaneously function as a deflector.
11. The magnetic deflector according to claim 1, wherein, when the cores are arranged opposite each other, a control voltage or current can be applied to the cores and the coils respectively, and thus the cores and the coils can be selectively or simultaneously controlled.
12. The magnetic deflector according to claim 11, wherein the cores function as a stigmator or a deflection unit for aligning an electron beam with a proviso that the coils selectively or simultaneously function as a deflector, or the coils function as a stigmator or a deflection unit for aligning an electron beam with a proviso that the cores selectively or simultaneously function as a deflector.
13. A microcolumn using the magnetic deflector according to claim 2.
14. The microcolumn according to claim 13, wherein, when the cores of the magnetic deflector are arranged opposite each other, a control voltage or current can be applied to the cores and the coils respectively, and thus the cores and the coils can be selectively or simultaneously controlled.
15. The microcolumn according to claim 14, wherein the cores function as a stigmator with a proviso that the coils selectively or simultaneously function as a deflector, or the coils function as a stigmator with a proviso that the cores selectively or simultaneously function as a deflector.
16. The microcolumn according to claim 13, wherein the magnetic deflector is arranged below a focusing lens.
17. A microcolumn using the magnetic deflector according to claim 1.
18. The microcolumn according to claim 17, wherein, when the cores of the magnetic deflector are arranged opposite each other, a control voltage or current can be applied to the cores and the coils respectively, and thus the cores and the coils can be selectively or simultaneously controlled.
19. The microcolumn according to claim 18, wherein the cores function as a stigmator with a proviso that the coils selectively or simultaneously function as a deflector, or the coils function as a stigmator with a proviso that the cores selectively or simultaneously function as a deflector.

* * * * *